(12) United States Patent
Repmann et al.

(10) Patent No.: US 7,927,907 B2
(45) Date of Patent: Apr. 19, 2011

(54) METHOD OF MAKING SILICON SOLAR CELLS CONTAINING μC SILICON LAYERS

(75) Inventors: Tobias Repmann, Aachen (DE); Bernd Rech, Aachen (DE)

(73) Assignee: Forschungszentrum Julich GmbH, Julich (DE)

( * ) Notice: Subject to any disclaimer, the term of this patent is extended or adjusted under 35 U.S.C. 154(b) by 602 days.

(21) Appl. No.: 10/587,131

(22) PCT Filed: Dec. 16, 2004

(86) PCT No.: PCT/DE2004/002752
§ 371 (c)(1),
(2), (4) Date: Jul. 21, 2008

(87) PCT Pub. No.: WO2005/071761
PCT Pub. Date: Aug. 4, 2005

(65) Prior Publication Data
US 2008/0274582 A1    Nov. 6, 2008

(30) Foreign Application Priority Data
Jan. 23, 2004 (DE) .......... 10 2004 003 761

(51) Int. Cl.
H01L 21/00 (2006.01)
H01L 21/20 (2006.01)
H01L 31/00 (2006.01)
C23C 16/00 (2006.01)

(52) U.S. Cl. .......... 438/57; 438/479; 438/485; 438/935; 118/723 MW; 136/258; 257/E21.297; 257/E31.048

(58) Field of Classification Search ............ 438/57, 438/479, 485, 935; 136/258; 257/E21.297, 257/E31.048; 118/723 MW
See application file for complete search history.

(56) References Cited

U.S. PATENT DOCUMENTS

| | | | | |
|---|---|---|---|---|
| 4,728,370 | A * | 3/1988 | Ishii et al. | 136/258 |
| 5,358,755 | A * | 10/1994 | Li et al. | 438/96 |
| 5,525,550 | A * | 6/1996 | Kato | 438/788 |
| 6,190,932 | B1 | 2/2001 | Yoshimi et al. | 438/24 |
| 6,287,888 | B1 * | 9/2001 | Sakakura et al. | 438/96 |
| 6,323,142 | B1 * | 11/2001 | Yamazaki et al. | 438/790 |
| 6,337,224 | B1 | 1/2002 | Okamoto et al. | 438/69 |
| 2002/0090815 | A1* | 7/2002 | Koike et al. | 438/680 |
| 2003/0124842 | A1* | 7/2003 | Hytros et al. | 438/680 |

FOREIGN PATENT DOCUMENTS

| | | |
|---|---|---|
| EP | 1032053 | 8/2000 |
| EP | 1 041 646 | 10/2000 |
| EP | 1041646 | 10/2000 |

OTHER PUBLICATIONS

Selvan et al. , "Evaluation of Ar-diluted silane PECVD for thin film Si:H based solar cells" Apr. 2004, Materials Research Soc., vol. 808, A9.46.1-A9.46.6.*
Li, Y M "Development of Advanced Deposition Technology for Microcrystalline Si Based Solar Cells and Modules: Final Technical Report, May 1, 2002-Jul. 31, 2004", National Renewable Energy Lab., pp. 23 and 68.*
Comprehensive Study of Microcrystalline Silicon . . . by Roschek et al. (J.Vac.Sci.Technol.May 4, 2002).
Fast Deposition of a-Si:H Layers . . . by Kroll et al. (Mat. Res. soc.Symp. Proc. 1999).
High Rte Deposition of Microcrystalline Silicon . . . by Roschek et al. (Mat.Res.Soc. Symp. Proc. 2002).
"Research on the boron contamination at the p/i interface of microcrystalline silicon solar cells . . . " Zhang, X et al; Chinese Physics B vol. 18, No. 19, Oct. 2009.
Reduction of the boron cross-contamination for plasma deposition of p-i-n devices in a singl-chamber large area rf reactor: Ballutaud, J, Science Direct Thin solid films 468, 2004 p. 222-225.
"Fast deposition of a-Sl:H layers and solar cells in a large-area . . . " Kroll, U; Mat. Res Soc. Symp Proc, vol. 557; 1999.
High-rate deposition of mycocrystalline silicon solar cells using . . . Roschek, T; Mat. Res Soc. Symp. Proc. vol. 715 2002 Materials Research Society.
"Comprehensive study of microcrystalline silicon solar cells deposited at high rate . . . " Roschek, T; J. Vac. Sci. Technol A 20(2) Mar./Apr. 2002 American Vacuum Society.

* cited by examiner

*Primary Examiner* — Walter L Lindsay, Jr.
*Assistant Examiner* — Ron Pompey
(74) *Attorney, Agent, or Firm* — Jonathan Myers; Andrew Wilford

(57) ABSTRACT

The invention relates to a method for producing solar cells comprising at least one p-i-n layer sequence containing micro-crystalline layers with the aid of a PECVD method. Said method is characterised in that all layers of the p-i-n layer sequence are deposited in a single-chamber process. The electrodes are interspaced at a distance of between 5 and 15 mm and the gas is distributed by means of a shower-head gas inlet, which guarantees a homogeneous distribution of the gas over the substrate. $SiH_4$ gas streams with values of between 0.01 and 3 sccm/cm$^2$ are added with a process pressure of between 8 and 50 hPa. The heater temperature is set at between 50 and 280° C. and the HF output is between 0.2 and 2 watt/cm$^2$. The $H_2$ gas streams have values of between 0.3 and 30 sccm/cm$^2$, in particular between 0.3 and 10 sccm/cm$^2$.

17 Claims, 1 Drawing Sheet

METHOD OF MAKING SILICON SOLAR CELLS CONTAINING μC SILICON LAYERS

CROSS REFERENCE TO RELATED APPLICATIONS

This application is the US national phase of PCT application PCT/DE2004/002752, filed 16 Dec. 2004, published 4 Aug. 2005 as WO2005/071761, and claiming the priority of German patent application 102004003761.2 itself filed 23 Jan. 2004, whose entire disclosures are herewith incorporated by reference.

FIELD OF THE INVENTION

The invention relates to a method for producing microcrystalline silicon (μc-Si), particularly (μc-Si:H) p-i-n solar cells as well as stacked solar cells made of amorphous (α-Si:H) and microcrystalline silicon in a p-i-n/p-i-n structure. The invention furthermore relates to a device for carrying out the method.

STATE OF THE ART

According to the present state of the art, μc-Si:H solar cells as well as α-Si:H/μc-Si:H solar cells are typically produced in multichamber plasma CVD equipment. The advantage with PECVD (=plasma enhanced chemical vapor deposition) methods of this type is that generally a contamination of the intrinsic absorber layer (i-layer) as a result of boron carry-over from the reactor walls and the electrode surface of the previously produced p-layer is avoided. The disadvantage is that the multichamber processes are time-consuming and therefore cost-intensive.

While in principle the production with single-chamber processes is possible, so far generally these have been conducted only with complex methods, for example with a plasma treatment or the intermediate outward transfer of the substrates to be coated. These production methods have therefore so far been little suited for an industrial production environment.

Single-chamber processes that are able to forego these complex methods have been long known for the production of amorphous solar cells [1]. In contrast, for the production of μc-Si:H solar cells very high hydrogen dilution rates are required, which however turned out to be particularly critical in terms of the carry-over problem. $H_2$ plasmas are generally very reactive and have caustic properties [2].

The production of a μc-Si:H solar cell using the single-chamber process was introduced in 2003 at the "3rd World Conference on Photovoltaic Energy Conversion" in Osaka, Japan. There it was revealed that in a commercial single-chamber reactor, which was is used until then for the production of α-Si:H solar cell modules, now μc-Si:H solar cells were being produced with the single-chamber method [3]. Process parameters that were mentioned included the use of an $SnO_2$ substrate, HF-PECVD deposition at 13.56 MHz and hydrosilicon that was highly diluted with hydrogen as the reaction gas. An electrode measuring 12"×15" was used for the simultaneous coating of four substrates, measuring 12"×15" respectively. As a result of the simultaneous coating, the very slow growth rate for μc-silicon was advantageously compensated. The substrate temperature was 200° C. For testing the quality of the produced layers, luminous flux voltage curves (I-V), dark current voltage curves (I-V) and the spectral response (QE) were measured. On a surface of about 0.146 $cm^2$ an efficiency of about 5% was achieved. The origin that was mentioned for the extreme nonhomogeneity was an insufficient gas distribution when using high HF output.

The present state of the art for μc-Si:H solar cells, as they can currently be produced with multichamber processes, however cannot be achieved by far with the afore-mentioned single-chamber processes in terms of efficiency and homogeneity.

OBJECT OF THE INVENTION

It is the object of the invention to provide a simple, cost-efficient method that is suitable for industrial applications, particularly for the production of solar cells with μc-Si:H layers. Additionally it is the object of the invention to create a device that is suitable for carrying out the afore-mentioned method.

SUMMARY OF THE INVENTION

The objects of the invention are attained with a method for producing μc-Si:H and also α-Si:H/μc-Si:H for solar cells entirely in a single-chamber process produces particularly large-surface homogeneous depositions, which are reflected in significantly higher efficiency rates that those achieved until now with single-chamber processes. The method furthermore overcomes the problem of the disadvantageous boron contamination in the intrinsic μc-silicon layers.

It was demonstrated that through PECVD at 13.56 MHz μc-Si:H can be produced homogeneously on surfaces measuring up to 30×30 $cm^2$ and that as a result high efficiency rates can be achieved in thin-film solar arrays. The deposition regime is characterized by the use of a high deposition pressure and high HF output levels. This combination produces high deposition rates, which achieve good material quality at the same time.

The single-chamber method according to the invention is based on this process. The method for producing homogeneous μc-silicon layers on a substrate, particularly the i- and p-layers for a solar cell with the help of plasma CVD at 13.56 MHz, is carried out in a deposition regime, which can be characterized by the process parameters outlined below. Additionally a process window range is listed, which according to present knowledge is considered particularly suited. This process window, however, can be expanded by using higher frequencies for the deposition. In this event, the process window would optionally expand towards lower pressure levels and greater hydrosilicon concentrations.

Process Parameters for the μc-Si:H Absorber Layer (i-layer):

| Parameters | Known Multichamber Process | Execution Example for Single-Chamber Process | Assumed Process Window for Single-Chamber Process |
|---|---|---|---|
| Electrode Spacing | 10 mm | 12.5 mm | 5 to 15 mm |
| Gas Distribution | Showerhead, 9 mm Grid, 3-Stage Gas Distribution | Showerhead, 9 mm Grid, 3-Stage Gas Distribution | Showerhead, Grid < Electrode Spacing |
| $H_2$ Gas Flow | 2.4 sccm/$cm^2$ (24 slm/$m^2$) | 1.4 sccm/$cm^2$ (14 slm/$m^2$) | >0.3 sccm/$cm^2$ (>3 slm/$m^2$) for homogeneity |
| $SiH_4$ Gas Flow | 0.02 sccm/$cm^2$ (0.2 slm/$m^2$) | 0.02 sccm/$cm^2$ (0.2 slm/$m^2$) | 0.01-3 sccm/$cm^2$ (0.1-30 slm/$m^2$) |
| Process | 13 hPa | 10.4 hPa | 3 to 50 hPa |

-continued

| Parameters | Known Multichamber Process | Execution Example for Single-Chamber Process | Assumed Process Window for Single-Chamber Process |
|---|---|---|---|
| Pressure | | | |
| Substrate Temp. | 150° C. | 150° C. | 50-220° C. |
| HF Output | 0.35 W/cm² | 0.35 W/cm² | 0.2-2 W/cm² |

Process parameters for the μc-Si:H p-layer:

Analogous to the i-layer, the μc-Si:H p-layer is produced in a deposition regime using a high deposition pressure and high HF output. In comparison with the i-layer, the hydrosilicon concentration is set to a higher level and has, for example 0.004 sccm/cm² SiH₄ (0.04 slm/m²) and 1.43 sccm/cm²H₂ (14.3 slm/m²).

In the method according to the invention, typically a plasma excitation frequency of 13.56 MHz is used, however also other, particularly higher, excitation frequency levels, for example 27 or 40.5 Hz (n-multiple of 13.56 Hz), are possible.

Optionally, also buffer layers can be applied when producing solar cells with microcrystalline silicon layers. The use of a buffer layer with a high $H_2$ dilution on the p/i interface advantageously further reduces the carry-over problem.

Process parameters for an optional μc-Si:H buffer layer:

A suitable μc-Si:H buffer layer, just like the μc-Si:H p-layer and i-layer, can be produced with a deposition regime using a high deposition pressure and high HF output. The hydrosilicon concentration and/or the hydrosilicon flow is set as high as for the μc-Si:H p-layer, however the buffer layer is deposited intrinsically, meaning without the addition of doping gas.

The effectiveness of a solar cell is generally greater the more defined the transition is from the p-layer to the i-layer, i.e. the area in which the recombination takes place. Typically, during the deposition of the i-layer on a highly doped p-layer carry-over occurs, during which boron is introduced in the i-layer. It has proven also to be advantageous if initially a slightly doped buffer layer of 5 to 100 nm with only low boron doping in the range of $1*10^{17}$ to $1*10^{18}$ atoms/cm³ is applied on the highly doped p-layer and only then the i-layer is deposited thereon. As a result, boron carry-over is advantageously considerably lower, and the produced layer sequence can generally be reproduced.

The device suitable for carrying out the method according to the invention comprises in addition to a conventional PECVD apparatus an optimized showerhead electrode, which is responsible for homogeneous gas distribution and supply as well as for feeding the HF output. With this, particularly large-surface homogeneous coatings are possible. The distribution stages are set to the conductance values to the deposition regime.

Using the single-chamber method according to the invention, μc-Si:H solar cell modules with efficiencies of up to 7.7% with an aperture surface (effectively used surface) of 64 cm² and α-Si:H/μc-Si:H modules with efficiencies of up to 10.6% with an aperture surface of likewise 64 cm² were produced. These values correspond to the state of the art as mentioned for known multichamber processes. The process parameters for the single-chamber process according to the invention are listed in the table. The substrate used was textured ZnO. The deposition rate was about 30 nm/min.

The layer thickness of the Si-layers was less than 2 mm. The contact that was used was ZnO/Ag. In order to verify the output of the solar cells that was produced, a standard measurement (STC) was carried out (AM 1.5, 100 mW/cm², 25° C.). To this end, the single-chamber method according to the invention is particularly suited for producing solar cells for larger surfaces also on an industrial scale. Increasing the scale of the method to surfaces measuring 1×1 m or even greater therefore typically does not present a problem.

SPECIFIC DESCRIPTION

Figure 1:
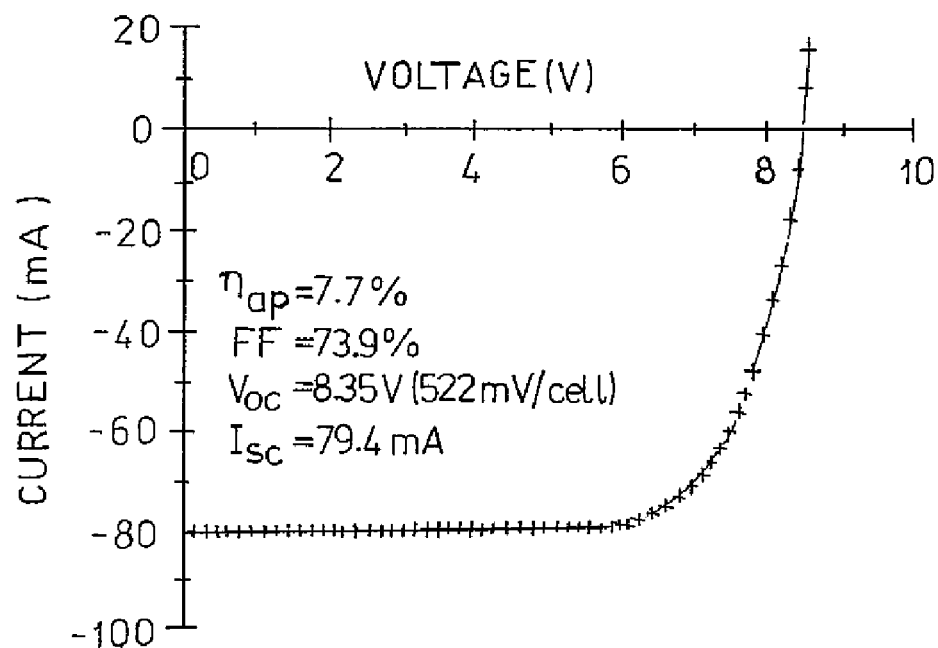
FIG. 1 shows the current voltage curve of a series-connected μc-Si:H module with an aperture surface of 64 cm².
Figure 2:
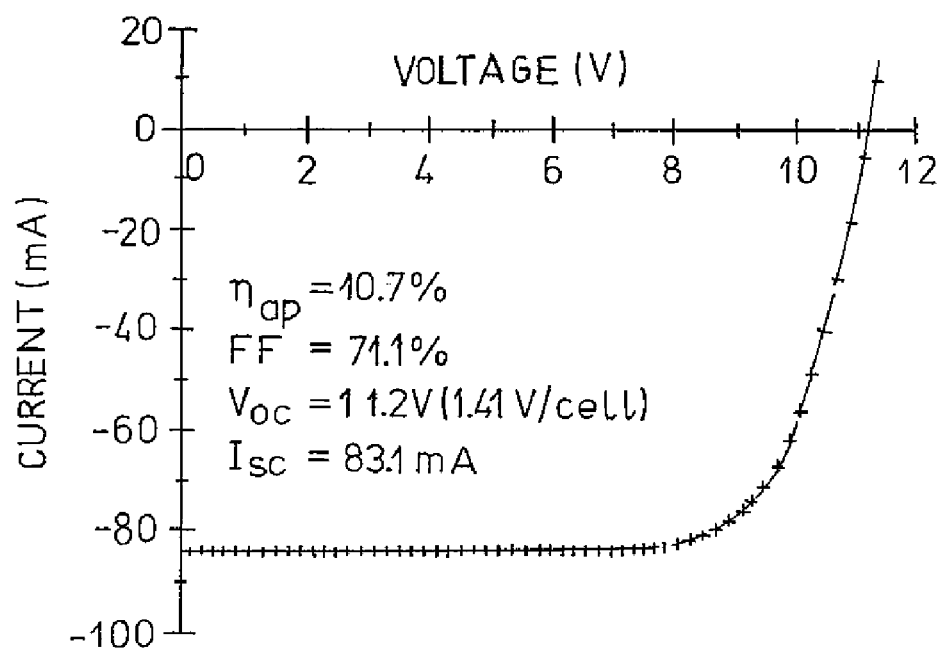
FIG. 2 illustrates the current voltage curve of a series-connected α-Si:H/μc-Si:H module with an aperture surface of 64 cm².

An additional buffer layer on the critical p/i interface, combined with the afore-mentioned deposition regime, during the production of μc-Si:H solar cells using a single-chamber process generally likewise produces high efficiency levels and moreover offers the advantage that the properties can be adjusted such that they can be regularly reproduced. Furthermore it was found that with this deposition regime the n/p transition during the production of α-Si:H/μc-Si:H solar cells can also be produced in a higher quality. The amorphous solar cells within the α-/Si:H/μc-Si:H solar cells can also be produced by using a buffer layer on the p/i interface.

LITERATURE CITED IN THE APPLICATION

[1] A. E. Delahoy, F. B. Ellis, Jr., E. Eser, S. Gau, H. Volltrauer, Z. Kiss, 6th E. C. Photovoltaic Energy Conf., London, (1984), 670.
[2] R. Platz, D. Fischer, S. Dubail, A. Shah, Sol. Energy Mat. and Sol. Cells 46 (1997), 157.
[3] Y.-M. Li, J. A. Anna Selvan, L. Li, R. A. Levy, A. E. Delahoy, 3rd World Conf. on Photovoltaic Energy Conv., Japan (2003), to be published.

The invention claimed is:

1. A method of making a solar cell having an a-Si:H/μc-Si:H layer sequence with the help of a PECVD method, the method comprising the steps of:
    depositing all layers of the amorphous and microcrystalline solar cell on a substrate using a single-chamber process having the following process parameters for the μc-Si:H absorber layer (i-layer),
    an electrode spacing between 5 and 15 mm,
    a gas distribution taking place via a showerhead gas inlet that ensures a homogeneous distribution of the gas across the substrate,
    an SiH₄ gas flow between 0.01 and 3 sccm/cm²,
    a process pressure between 3 and 50 hPa,
    a heater temperature for the substrate between 50 and 280° C., and
    an HF output set to between 0.2 and 2 Watt/cm², and
    depositing the i-layer of the microcrystalline cell on a doped p-layer, deposited on the substrate, while avoiding boron cross contamination from the p-layer to the i-layer, whereby the high efficiency of a known multichamber process using a high deposition pressure and a high HF output level is achieved.

2. The method according to claim 1, wherein the electrode spacing is between 10 and 15 mm.

3. The method according to claim 1 wherein the showerhead gas inlet comprises a grid that is smaller than the selected electrode spacing.

4. The method according to claim 1 wherein $H_2$ gas flow is between 0.3 and 30 sccm/cm$^2$.

5. The method according to claim 1 wherein $SiH_4$ gas flow is between 0.01 and 1 sccm/cm$^2$.

6. The method according to claim 1 wherein a process pressure is between 8 and 15 hPa.

7. The method according to claim 1 wherein the heater temperature for the substrate is between 80 and 180° C.

8. The method according to claim 1 wherein at least one homogeneous µc-silicon layer is deposited on a substrate measuring more than 20×20 cm.

9. The method according to claim 1 wherein a textured ZnO is used as the substrate.

10. The method according to claim 1 wherein an additional buffer layer is deposited between the p- and i-layers.

11. The method according to claim 1 wherein substrates measuring more than 30×30 cm are coated homogeneously.

12. The method according to claim 1 wherein a higher plasma excitation frequency is selected.

13. The method according to claim 1 wherein $H_2$ gas flow is between 0.3 and 10 sccm/cm$^2$.

14. The method according to claim 1 wherein at least one homogeneous µc-silicon layer is deposited on a substrate measuring more than 30×30 cm.

15. The method according to claim 1 wherein substrates measuring more than 50×50 cm are coated homogeneously.

16. The method according to claim 1 wherein substrates measuring more than 1 m×1 m are coated homogeneously.

17. The method according to claim 1 wherein a higher plasma excitation frequency is selected that is a multiple of 13.56 MHz.

* * * * *